United States Patent
Lin et al.

(10) Patent No.: US 7,445,949 B2
(45) Date of Patent: Nov. 4, 2008

(54) METHOD OF MANUFACTURING SEMICONDUCTOR LASER DEVICE STRUCTURE

(75) Inventors: Hung-Cheng Lin, Taoyuan (TW);
Jen-Inn Chyi, Taoyuan (TW);
Guan-Ting Chen, Taoyuan (TW)

(73) Assignee: National Central University, Taoyuan (TW)

( * ) Notice: Subject to any disclaimer, the term of this patent is extended or adjusted under 35 U.S.C. 154(b) by 393 days.

(21) Appl. No.: 10/710,843

(22) Filed: Aug. 6, 2004

(65) Prior Publication Data
US 2005/0226297 A1    Oct. 13, 2005

(30) Foreign Application Priority Data
Apr. 6, 2004    (TW) ............................... 93109437 A

(51) Int. Cl.
*H01L 21/00*    (2006.01)
(52) U.S. Cl. ............................. 438/39; 438/41; 438/42; 438/43; 438/44; 257/466
(58) Field of Classification Search ............. 438/39–44, 438/673, 734, 736; 257/266, 623
See application file for complete search history.

(56) References Cited
U.S. PATENT DOCUMENTS

| | | | | |
|---|---|---|---|---|
| 2004/0245540 A1* | 12/2004 | Hata et al. | ..................... | 257/99 |
| 2004/0248334 A1* | 12/2004 | Hoss et al. | ..................... | 438/39 |
| 2005/0218414 A1* | 10/2005 | Ueda et al. | ..................... | 257/94 |
| 2006/0175621 A1* | 8/2006 | Ohtsuka et al. | ............... | 257/88 |

* cited by examiner

*Primary Examiner*—Lex Malsawma
*Assistant Examiner*—Jae Lee
(74) *Attorney, Agent, or Firm*—Jianq Chyun IP Office

(57) ABSTRACT

A method of manufacturing a semiconductor laser device is provided. First, a first mask layer is formed on an epitaxial structure to define a protrudent area in a ridge structure. Thereafter, a conformal second mask layer is formed over the epitaxial structure to cover the first mask layer. A third mask layer is formed over the second mask layer. The exposed second mask layer is removed. Using the first and the third mask layers as etching masks, a portion of the epitaxial structure is removed. The third mask layer and the remaining second mask layer are removed to form the ridge structure. An insulation layer is formed on the epitaxial structure and then the first mask layer is removed to expose the top surface of the protrudent area. A conductive layer is formed on the epitaxial structure such that it contacts with the top surface of the protrudent area.

10 Claims, 5 Drawing Sheets

METHOD OF MANUFACTURING SEMICONDUCTOR LASER DEVICE STRUCTURE

CROSS REFERENCE TO RELATED APPLICATIONS

This application claims the priority benefit of Taiwan application serial No. 93109437, filed Apr. 6, 2004.

BACKGROUND OF INVENTION

1. Field of the Invention

The present invention relates to a method of manufacturing a semiconductor laser device. More particularly, the present invention relates to a semiconductor laser device and method of manufacturing the same that can prevent alignment error when defining the location of a P-type metal.

2. Description of the Related Art

In the conventional method of fabricating a 2~5 μm ridge type waveguide laser, it is difficult to position the P-type metal accurately on top of an protrudent platform of the ridge type waveguide laser because the area at the top surface of the protrudent platform is extremely small.

FIG. 1 is a schematic cross-sectional view showing a conventional semiconductor laser device in the process of defining the location of a P-type metal. As shown in FIG. 1, an epitaxial layer 100 is shaped into a ridge structure 106 comprising two channels 102 and an protrudent block 104. Thereafter, a P-type metal 108 is defined on the protrudent block 104. However, an accurate alignment of the P-type metal 108 is difficult because the top area of the protrudent block 104 is very small.

FIG. 2 is a schematic cross-sectional view showing another conventional semiconductor laser device in the process of defining the location of a P-type metal. As shown in FIG. 2, an epitaxial layer 200 is shaped into a ridge structure 206 comprising two channels 202 and a protrudent block 204. Thereafter, an insulating layer 210 is formed over the epitaxial structure 200 and then photolithographic and etching processes are carried out to expose the area for forming the P-type metal. However, due to possible misalignment in the process of defining the insulating layer 210, the top surface of the protrudent block 204 may not be accurately exposed. Consequently, a subsequently formed P-type metal will not fully contact with the top surface of the protrudent block 204.

At present, one of the solutions is to reduce the size of the P-type metal. FIG. 3 is a schematic cross-sectional view showing yet another conventional semiconductor laser device in the process of defining the location of a P-type metal. As shown in FIG. 3, an epitaxial layer 300 is shaped into a ridge structure 306 comprising two channels 302 and a protrudent block 304. Thereafter, an insulating layer 308 is formed over the epitaxial structure 300. Photolithographic and etching processes are carried out in sequence to expose the area for forming the P-type metal. After that, a P-type metal 310 is formed on the exposed surface of the protrudent block 304. Although this method is capable of reducing alignment errors, the P-type metal covers only a portion of the top surface of the protrudent block 304 within the ridge structure 306. In other words, the P-type metal will have a higher ohmic contact resistance and a lower heat-dissipating capacity.

SUMMARY OF INVENTION

Accordingly, at least one objective of the present invention is to provide a method of fabricating a semiconductor laser device capable of tolerating a larger alignment error and having a lower ohmic contact resistance and a higher heat dissipating capacity so that overall optical and electrical performance is improved.

At least a second objective of the present invention is to provide a method of fabricating a semiconductor laser device capable of producing a P-type electrode and an N-type electrode at the same time to simplify the fabrication process and increase the product yield.

At least a third objective of the present invention is to provide a semiconductor laser device structure having a lower ohmic contact resistance.

To achieve these and other advantages and in accordance with the purpose of the invention, as embodied and broadly described herein, the invention provides a method of fabricating a semiconductor laser device. First, an epitaxial structure is provided. A first mask layer is formed over the epitaxial structure to define an protrudent area in a ridge structure. Thereafter, a conformal second mask layer is formed over the epitaxial structure to cover the first mask layer. A third mask layer is formed over the second mask layer to expose a portion of the second mask layer. The exposed second mask layer is removed. Using the first mask layer and the third mask layer as an etching mask, a portion of the epitaxial structure is removed to form the ridge structure. After that, the third mask layer together with the remaining second mask layer is removed. An insulation layer is formed on the epitaxial structure and then the first mask layer is removed to expose a portion of the top surface of the protrudent area. Finally, a conductive layer is formed on the epitaxial structure such that the conductive layer makes contact with the top surface of the protrudent area.

The present invention also provides an alternative method of fabricating a semiconductor laser device. First, an epitaxial structure comprising an N-type electrode area and a P-type electrode area is provided. A first mask layer is formed over the P-type electrode area and the N-type electrode area of the epitaxial structure to define an protrudent area of a ridge structure within the P-type electrode area an N-type ohmic contact metal area within the N-type electrode area. Thereafter, a conformal second mask layer is formed over the epitaxial structure. A third mask layer is formed over the second mask layer to expose a portion of the second mask layer above the first mask layer within the P-type electrode area. The exposed second mask layer is removed. Using the first mask layer and the third mask layer within the P-type electrode area as an etching mask, a portion of the epitaxial structure is removed to form the ridge structure. After that, the third mask layer together with the remaining second mask layer is removed. An insulation layer is formed to cover the ridge structure within the P-type electrode area and the N-type ohmic contact metal area within the N-type electrode area. Then, the first mask layer is removed to expose the top surface of the protrudent area within the P-type electrode area and the N-type ohmic contact metal area within the N-type electrode area. A first conductive layer is formed over the exposed N-type ohmic contact metal area. Finally, a second conductive layer is formed on the top surface of the protrudent area such that the second conductive layer makes full contact with the top surface of the protrudent area.

The present invention also provides a semiconductor laser device structure comprising a substrate, a second cladding layer over the substrate and a second ohmic contact layer over the second cladding layer. A ridge structure is formed within the second cladding layer and the second ohmic contact layer. The ridge structure comprises two channels and an protrudent block. The two channels penetrate a definite thickness of the second ohmic contact layer and the second cladding layer. The protrudent block is located between the two channels. Furthermore, an insulating layer is positioned over the second ohmic contact layer outside the top surface of the protrudent block and a conductive layer is positioned to enclose the ridge structure and make contact with the top surface of the protrudent block. In addition, a first ohmic contact layer, a first cladding layer, a first waveguide layer, a light-emitting layer and a second waveguide layer are sequentially stacked up from the substrate to meet the second cladding layer.

In the present invention, the channels of the ridge structure are protected by an insulation layer so that the conductive layer can cover a wider area. Hence, the semiconductor laser device can tolerate a larger alignment error and have a lower ohmic contact resistance and a higher heat dissipating capacity so that overall optical and electrical performance is improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
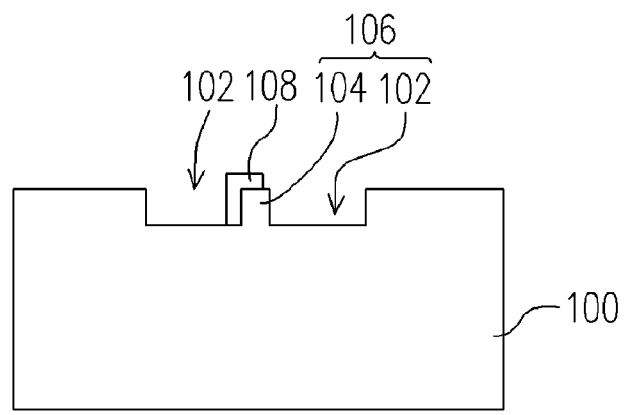
FIG. 1 is a schematic cross-sectional view showing a conventional semiconductor laser device in the process of defining the location of a P-type metal.
Figure 2:
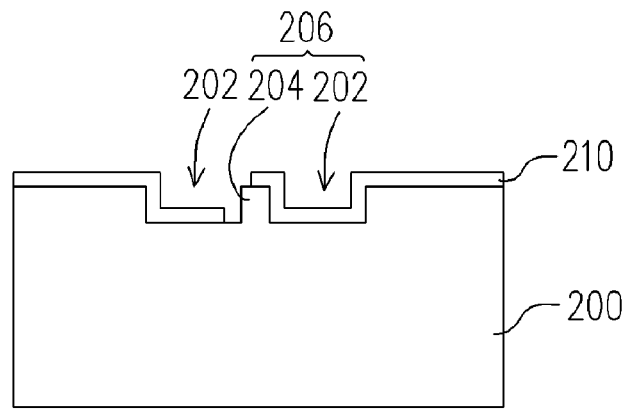
FIG. 2 is a schematic cross-sectional view showing another conventional semiconductor laser device in the process of defining the location of a P-type metal.
Figure 3:
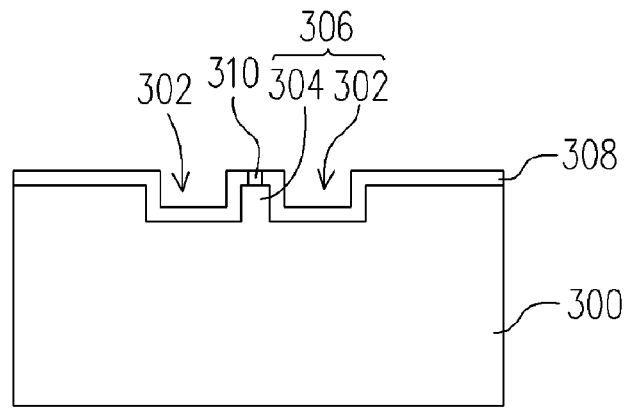
FIG. 3 is a schematic cross-sectional view showing yet another conventional semiconductor laser device in the process of defining the location of a P-type metal.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
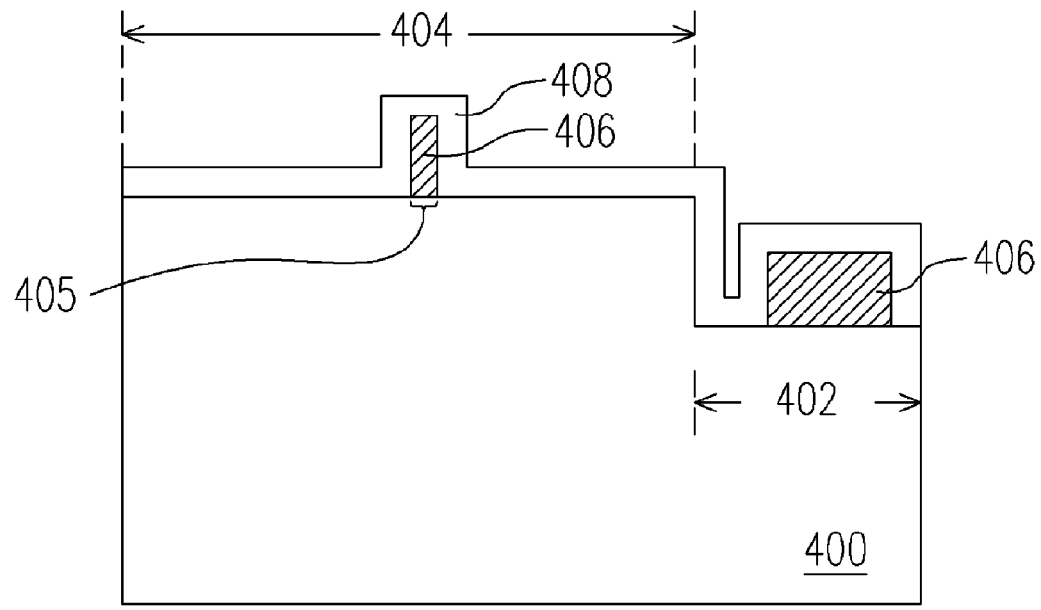
FIGS. 4A through 4F are schematic cross-sectional views showing the steps for fabricating a semiconductor laser device according to a first embodiment of the present invention.

FIGS. 4A through 4F are schematic cross-sectional views showing the steps for fabricating a semiconductor laser device according to a first embodiment of the present invention. As shown in FIG. 4A, an epitaxial structure 400 comprising an N-type electrode area 402 and a P-type electrode area 404 is provided. A first mask layer 406 is formed over the P-type electrode area 404 and the N-type electrode area 402 of the epitaxial structure 400 to define a protrudent area 405 in a ridge structure within the P-type electrode area and an N-type ohmic contact metal area within the N-type electrode area 402. Thereafter, a conformal second mask layer 408 is formed over the epitaxial structure 400 to cover the first mask layer 406. The N-type electrode area 402 is an N-type ohmic contact layer and the P-type electrode area 404 is a P-type ohmic contact layer, for example. The second mask layer 408 is a silicon oxide layer or a layer fabricated from other suitable material. The first mask layer 406 is a fabricated using nickel, for example.

Figure 4B:
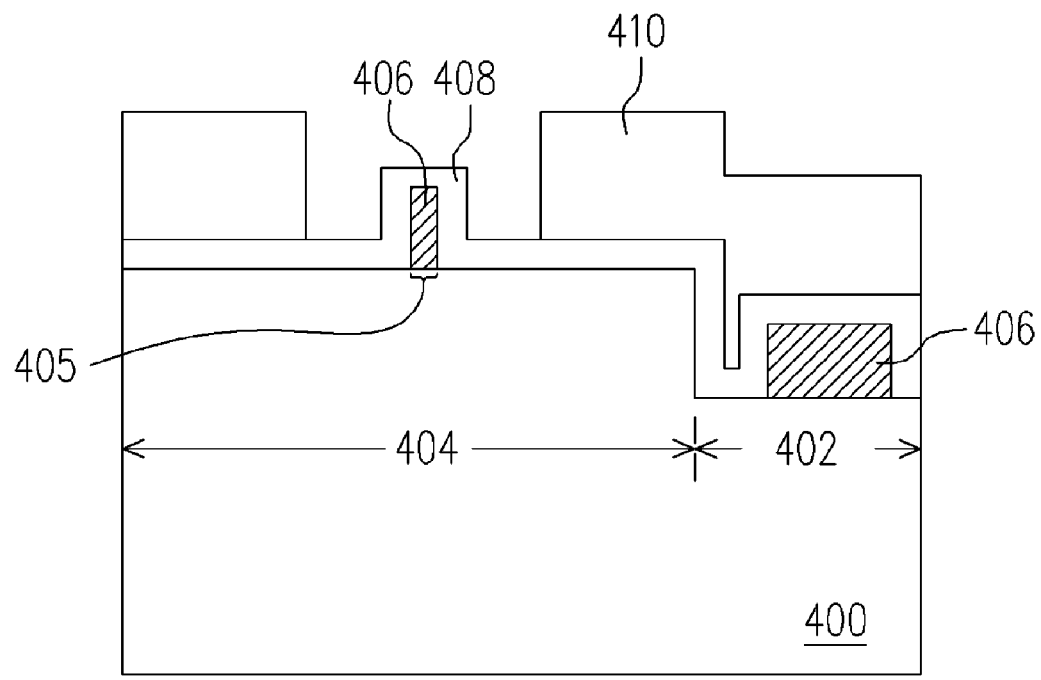

As shown in FIG. 4B, a third mask layer 410 is formed over the second mask layer 408 to expose a portion of the second mask layer 408 above the first mask layer 406 within the P-type electrode area 404.

Figure 4C:
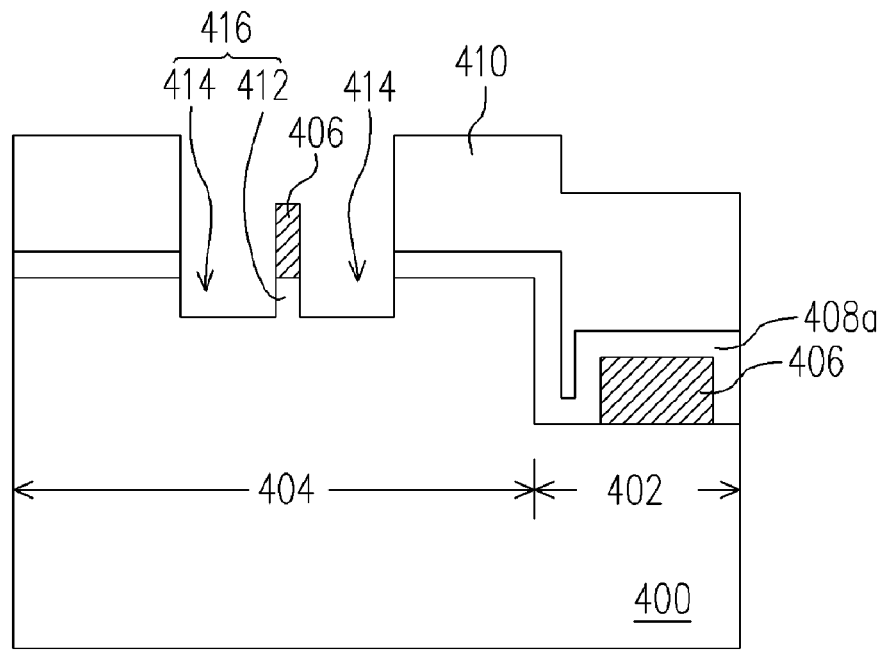

As shown in FIG. 4C, the exposed second mask layer 408 is removed. After that, using the first mask layer 406 and the third mask layer 410 inside the P-type electrode area 404 as an etching mask, a portion of the epitaxial structure 400 is removed to form a ridge structure 416 in the P-type electrode area 404. The ridge structure 416 comprises a pair of channels 414 and a protrudent block 412. The protrudent block 412 has a width between 1 μm to 10 μm. The method of etching away part of the epitaxial structure 400 comprises performing a reactive ion etching operation using gaseous etchant Ar/CH$_4$/Cl$_2$/He, for example.

Figure 4D:
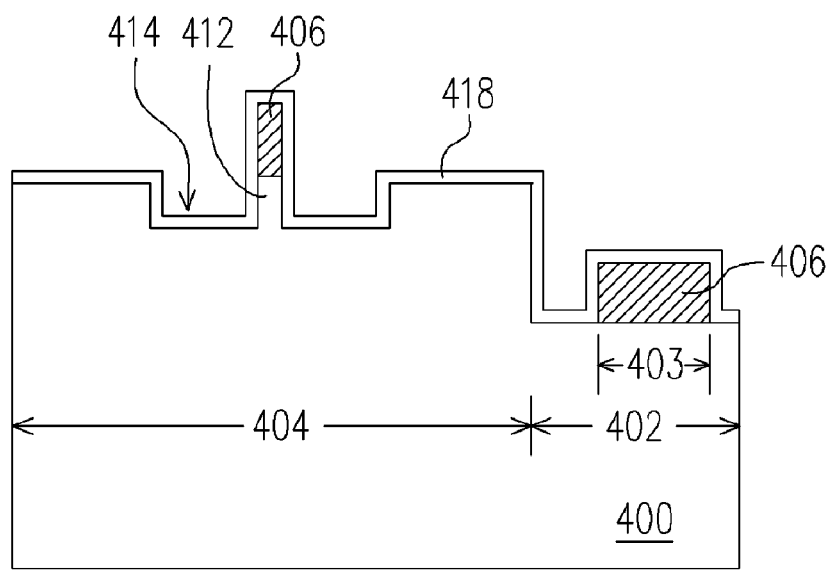

As shown in FIG. 4D, the third mask layer 410 and the remaining second mask layer 480a are removed. Thereafter, an insulating layer 418 is formed over the epitaxial structure 400 to cover the top surface of the protrudent block 412 of the ridge structure 416 within the P-type electrode area 404 and the N-type ohmic contact metal area 403 within the N-type electrode area 402. The insulating layer 418 is fabricated from silicon oxide material, for example.

Figure 4E:
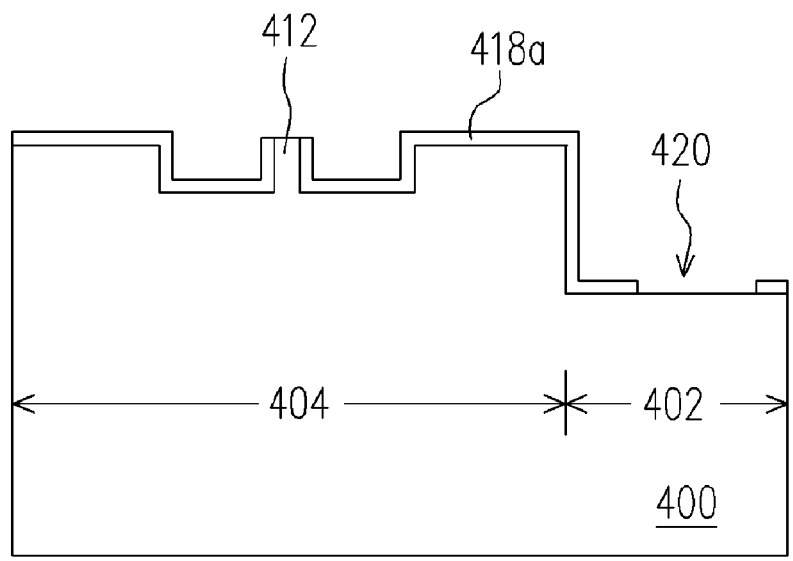

As shown in FIG. 4E, the first mask layer 406 is removed to expose the top surface of the protrudent block 412 within the P-type electrode area 404 and the N-type ohmic contact metal area 420 within the N-type electrode area 402. The method of removing the first mask layer 406 comprises etching with hot nitric/hydrochloric acid solution (HNO$_3$:HCl=1:3 at 105° C.).

Figure 4F:
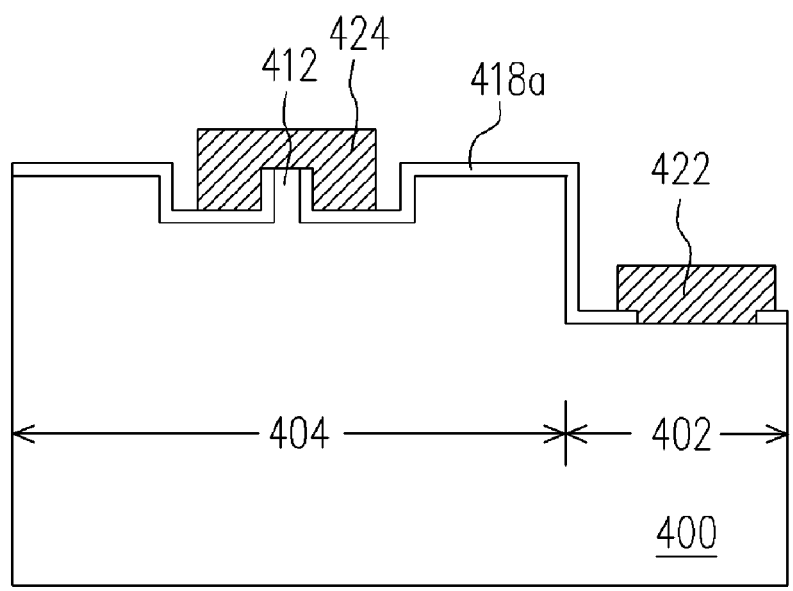

As shown in FIG. 4F, a first conductive layer 422 is formed on the exposed N-type electrode area 402 and a second conductive layer 424 is formed on the top surface of the protrudent block 412. The second conductive layer 424 fully contacts the top surface of the protrudent block 412. The first conductive layer 422 can be an N-type titanium/aluminum/titanium/gold layer and the second conductive layer 424 can be a P-type nickel/gold layer, for example. In a subsequent step, a metallic layer is formed over the epitaxial structure to cover the first conductive layer 422 and the second conductive layer 424 and serve as an electrode.

Figure 5:
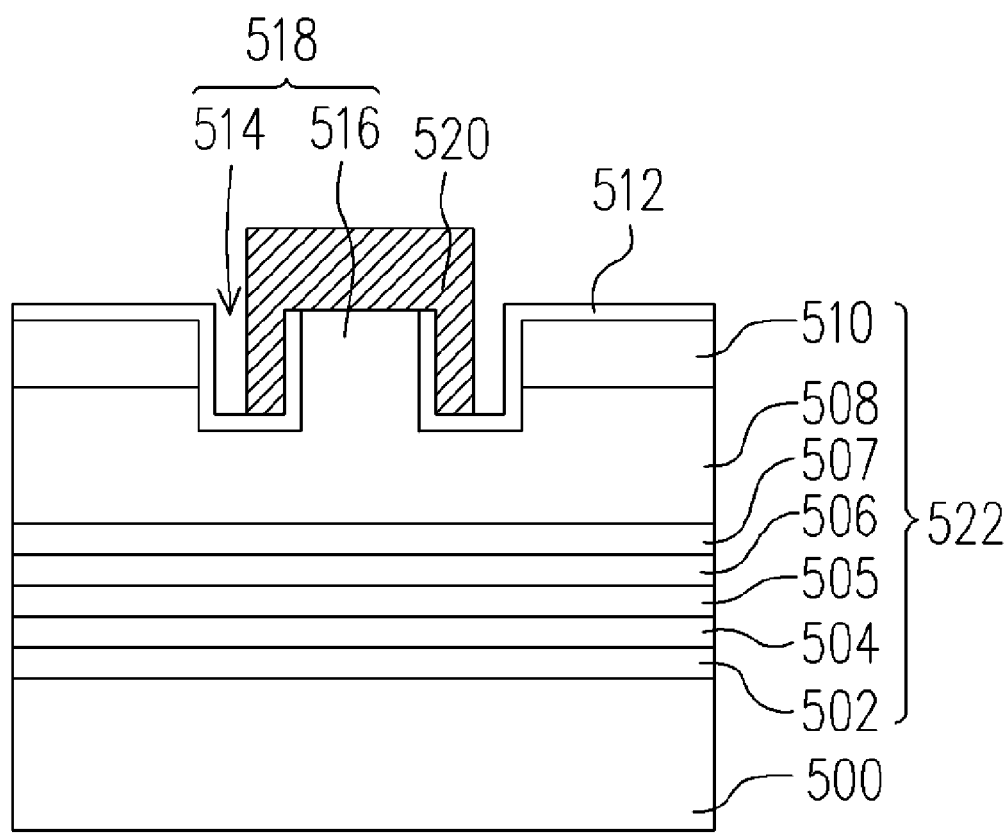
FIG. 5 is a schematic cross-sectional view of a semiconductor laser device according to a second embodiment of the present invention.

FIG. 5 is a schematic cross-sectional view of a semiconductor laser device according to a second embodiment of the present invention. As shown in FIG. 5, the structure comprises a substrate 500 having a first ohmic contact layer 502, a first cladding layer 504, a first waveguide layer 505, a light-emitting layer 506, a second waveguide layer 507, a second cladding layer 508 and a second ohmic contact layer 510 sequentially stacked thereon. The first ohmic contact layer 502, the first cladding layer 504, the first waveguide layer 505, the light-emitting layer 506, the second waveguide layer 507, the second cladding layer 508 and the second ohmic contact layer 510 together form an epitaxial structure 522. Furthermore, a ridge structure 518 is formed within the second cladding layer 508 and the second ohmic contact layer 510. The ridge structure 518 comprises a pair of channels 514 and an protrudent block 516. The protrudent block 516 is located between the two channels. The channels 514 penetrate a certain thickness of the second ohmic contact layer 510 and the second cladding layer 508. An insulating layer 512 is positioned over the second ohmic contact layer 510 outside the top surface of the protrudent block 516. A conductive layer 520 encloses the ridge structure 518 and makes contact with the top surface of the protrudent block 516. The first ohmic contact layer 502 and the first cladding layer 504 are N-type ohmic contact layer and N-type cladding layer respectively. The second cladding layer 508 and the second ohmic contact layer 510 are P-type cladding layer and P-type ohmic contact layer respectively.

In the present invention, the channels of the ridge structure are protected by an insulation layer so that the conductive layer can cover a wider area. Hence, the semiconductor laser device can tolerate a larger misalignment and have a lower ohmic contact resistance and a higher heat dissipating capacity so that overall optical and electrical performance is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of fabricating a semiconductor laser device, comprising the steps of:
   providing an epitaxial structure having an N-type electrode area and a P-type electrode area;
   forming a first mask layer over the epitaxial structure to define a protrudent area of a ridge structure within the P-type electrode area and an N-type ohmic contact metal area within the N-type electrode area;
   forming a conformal second mask layer over the epitaxial structure to cover the first mask layer;
   forming a third mask layer over the second mask layer to expose a portion of the second mask layer above the first mask layer within the P-type electrode area;
   removing the exposed second mask layer;
   removing a portion of the epitaxial structure using the first mask layer and the third mask layer within the P-type electrode area as an etching mask to form the ridge structure inside the P-type electrode area;
   removing the third mask layer and the remaining second mask layer;
   forming an insulating layer over the epitaxial structure to cover the ridge structure within the P-type electrode area and the N-type ohmic contact metal area within the N-type electrode area;
   removing the first mask layer to expose the top surface of the protrudent area of the ridge structure within the P-type electrode area and the N-type ohmic contact metal area within the N-type electrode area;
   forming a first conductive layer over the exposed N-type ohmic contact metal area; and
   forming a second conductive layer over the top surface of the protrudent area, wherein the second conductive layer fully contacts the top surface of the protrudent area.

2. The method of claim 1, wherein the step of removing a portion of the epitaxial structure comprises performing a reactive ion etching operation.

3. The method of claim 1, wherein the gaseous etchant used in the reactive ion etching operation comprise argon, methane, chlorine and helium ($Ar/CH_4/Cl_2/He$).

4. The method of claim 1, wherein the material constituting the insulating layer comprises silicon oxide.

5. The method of claim 1, wherein the step of removing the first mask layer comprises etching the epitaxial structure with a boiling mixture of nitric acid and hydrochloric acid solution.

6. The method of claim 1, wherein the material constituting the first mask layer, the second mask layer and the third mask layer is selected from a group consisting of silicon nitride, silicon oxide, metal, single photoresist layer, multi-layered structure and various combinations of the above.

7. The method of claim 1, wherein after forming the second conductive layer over the top surface of the protrudent area, further comprises forming a metallic layer over the epitaxial structure to cover the first conductive layer and the second conductive layer.

8. The method of claim 1, wherein the material constituting the mask layer comprises nickel.

9. The method of claim 1, wherein the material constituting the first conductive layer comprises N-type titanium/aluminum/titanium/gold.

10. The method of claim 1, wherein the material constituting the. conductive layer comprises P-type nickel/gold.

* * * * *